United States Patent [19]
Kugo et al.

[11] Patent Number: 6,007,673
[45] Date of Patent: Dec. 28, 1999

[54] APPARATUS AND METHOD OF PRODUCING AN ELECTRONIC DEVICE

[75] Inventors: Shunsuke Kugo, Kyoto; Hideo Nikoh, Shiga; Tomoyuki Sasaki, Kyoto; Hideo Ichimura, Osaka; Daihei Kajiwara, Toyama; Shoji Matsumoto, Toyama; Satoshi Nakagawa, Toyama, all of Japan

[73] Assignee: Matsushita Electronics Corporation, Osaka, Japan

[21] Appl. No.: 08/942,441

[22] Filed: Oct. 1, 1997

[30] Foreign Application Priority Data

Oct. 2, 1996 [JP] Japan .................................. 8-262119

[51] Int. Cl.$^6$ .............................. B44C 1/22; H01L 21/00
[52] U.S. Cl. ............................ 156/345; 216/67; 438/710
[58] Field of Search ..................... 156/345 P, 345 PT; 216/67–71; 438/710, 726, 727, 728, 729, 730, 732; 204/298.31, 298.37, 298.38

[56] References Cited

U.S. PATENT DOCUMENTS

| | | |
|---|---|---|
| 4,891,499 | 1/1990 | Moslehi . |
| 5,135,629 | 8/1992 | Sawada et al. . |
| 5,364,488 | 11/1994 | Minato et al. ................. 156/345 |
| 5,451,290 | 9/1995 | Salfelder . |
| 5,474,649 | 12/1995 | Kava et al. ................. 156/345 X |

FOREIGN PATENT DOCUMENTS

| | | |
|---|---|---|
| 0446657 | 2/1991 | European Pat. Off. . |
| 0589237 | 8/1993 | European Pat. Off. . |
| 0709488 | 10/1995 | European Pat. Off. . |
| 55062160 | 5/1980 | Japan . |
| 01211921 | 8/1989 | Japan . |
| 06196421 | 7/1994 | Japan . |

*Primary Examiner*—William Powell
*Attorney, Agent, or Firm*—McDermott, Will & Emery

[57] ABSTRACT

A semiconductor substrate which is placed on a bottom electrode inside a chamber is dry-etched by creating plasma inside the chamber. By making the average surface roughness Ra of the bottom surface of a quartz-top plate placed on the bottom electrode be in a range of 0.2 to 5 $\mu$m, adhesion between the quartz-top plate and the deposits caused by the dry etching is enhanced, and the number of particles suspended in the chamber is reduced. Furthermore, the function of enhancing the adhesion of deposits can be maintained even after cleaning of the quartz-top plate. As a result, the number of particles which adhere onto the semiconductor substrate is reduced and the semiconductor substrate can be processed in an extremely clean atmosphere.

19 Claims, 10 Drawing Sheets

6,007,673

APPARATUS AND METHOD OF PRODUCING AN ELECTRONIC DEVICE

BACKGROUND OF THE INVENTION

The present invention relates to an apparatus and method of producing an electronic device by applying dry etching, sputtering CVD, or another process in a chamber.

Recently, along with the high density or high integration of electronic devices, there has been a growing demand for high level processing precision. Therefore, when dry etching, sputtering CVD, or another process is applied during the production of LSI where a large number of transistors are integrated or a liquid crystal device where a large number of elements such as TFT are integrated, a workpiece to be processed is placed inside the chamber, so as to secure an atmosphere necessary for applying the process and a clean atmosphere with few particles.

A conventional apparatus and method of producing an electronic device will be described by taking the case of a conventional dry etching process.

FIG. 10 is a plasma apparatus disclosed in Japanese Laid-open Patent Application No. 6-196421 which makes use of an electron cyclotron resonance (ECR).

As shown in FIG. 10, in a plasma creation room 101 provided with a microwave introduction window 101a and a plasma drawing window 101b, a bell jar 104 is provided which has been subjected to a surface-roughening process with a frost treatment. A sample room 103 which has a table 108 for placing a sample S thereon is adjacently connected with the plasma creation room 101, and further connected with a gas introduction tube 109 and an evacuation tube 111. An anti-adhesive plate 105 is provided along the sample room 103, the table 108, and one end of the evacuation tube 111. Top heating walls 106a and 106b and bottom heating walls 107a and 107b are provided on the side wall of the plasma creation room 101, the side and lower walls of the sample room 103, and the outer surface of one end of the evacuation tube 111, respectively. An excitation coil 112 is provided along the circumference of a top heating wall 106 and one end of a wave guide 102 which is connected with the plasma creation room 101. A heated liquid is circulated along the top heating walls 106a and 106b and the bottom heating walls 107a and 107b, so as to heat the bell jar 104 and the anti-adhesive plate 105, thereby applying a plasma treatment to the sample S. The inner surfaces of the bell jar 104 and the anti-adhesive plate 105 have been subjected to a surface-roughening process.

Thus, a surface-roughening process used to be applied exclusively to the inner surface of the anti-adhesive plate 105. However, considering that the falling of products (deposits) occurs in the bell jar 104, too, the surface roughening process is also applied to the inner surface of the bell jar 104, so as to enhance the effect of adhering products as deposits, which result from a plasma treatment or the like, onto the inner surface which has been subjected to the surface roughening process. Consequently, the adhesion of the products onto the inner surface of the bell jar 104 is enhanced, and the falling of the products is restricted, so that the number of particles which adhere onto the sample S is reduced.

However, the above-mentioned conventional plasma apparatus has the following problem because the function of the apparatus after cleaning is conducted when the apparatus has been used for a certain time period is not taken into consideration.

For example, in order to remove products containing silicon from a quartz bell jar whose inner surface has an average surface roughness Ra of 10 μm, the bell jar must be immersed in a 1% aqueous solution of fluoric acid for about an hour under ultrasonic. However, the immersion of the bell jar in the aqueous solution of fluoric acid for such a long time period under ultrasonic causes the inner surface itself of the quartz bell jar to be etched and the inner surface which has been subjected to the surface roughening process to become more even. As a result, the function of enhancing the adhesion of the products onto the inner surface of the bell jar or the like is deteriorated after the bell jar is cleaned. In order to maintain the function of enhancing the adhesion of the products, the surface roughening process must be applied every time the quartz bell jar is cleaned. Such a troublesome process exhausts the quartz bell jar, making it unusable.

After having examined the conditions of unevenness of the inner surface which are needed to maintain the function of enhancing the adhesion of deposits such as a quartz member after cleaning, the inventors of the present invention have found that the average surface roughness Ra of the inner surface is more important than the maximum surface roughness Rmax of the inner surface. To be more specific, the maximum surface roughness Rmax indicates the difference between the peak value and the trough value in a comparatively wide range in the lateral direction. In the meanwhile, the average surface roughness Ra indicates the average size of unevenness in a minute range in the lateral direction. The easiness of removing deposits depends on how deep the deposits are engaged in the concave portions in the minute range. In contrast, according to the prior art including the above-mentioned Japanese Laid-open Patent Application, there is no consideration about how the average surface roughness Ra is dealt with in order to maintain the function of enhancing the adhesion of deposits after cleaning. Therefore, there is a fear that the effects may not be maintained after the apparatus is cleaned every time it is used for a certain time period.

SUMMARY OF THE INVENTION

The object of the present invention is, in an apparatus and method of producing an electronic device, to provide a means for maintaining, even after cleaning, the function of enhancing the adhesion of deposits resulting from a reaction onto the surface of a member which is exposed in the chamber, thereby improving the yield during the production of the electronic device and the reliability of the produced electronic device.

The first electronic device production apparatus in the present invention is an electronic device production apparatus for producing an electronic device by applying a process to a workpiece, and the electronic device production apparatus comprises: a chamber which is so constructed as to keep an internal atmosphere in an atmosphere for enabling the workpiece to be processed; a workpiece placing unit which is provided inside the chamber to place the workpiece thereon; and a minute uneven portion which is formed on the inner surface of a ceiling portion of the chamber and which has the function of enhancing adhesion of products generated while the workpiece is being processed and has an average surface roughness Ra which enables the function to be maintained even after cleaning of the ceiling portion.

Consequently, the adhesion between the products which adhere onto the minute uneven portion of the ceiling portion and the minute uneven portion is enhanced, which prevents a layer of the products from falling in part due to a temperature change or another reason, so as to reduce the number of particles suspended in the chamber. In addition, the minute uneven portion expands the area of the ceiling portion, which allows more products to adhere thereonto, thereby further decreasing the number of particles suspended in the chamber. Furthermore, by considering the fact that the average surface roughness Ra in the ceiling portion has a deep correlation with the easiness of falling the adhered products and also with the easiness of removing the adhered products while the ceiling portion is being cleaned, the above-mentioned apparatus is constructed so that the average surface roughness Ra of the minute uneven portion is within an appropriate range. Consequently, the number of particles which adhere onto a workpiece while the apparatus is used for a long time period can be reduced.

When the ceiling portion is made from silica glass, it is preferable that the average surface roughness Ra of the minute uneven portion is made to be 0.2 to 5 $\mu$m.

It has been verified from the results of experiments on silica glass members that the number of particles which adhere onto the workpiece while it is being processed can be reduced in spite of a large number of times of cleaning.

The electronic device production apparatus may include a coil which is provided outside the chamber and in the vicinity of the ceiling portion, in order to transmit an electromagnetic wave for creating inductively coupled plasma inside the chamber.

Consequently, an electric field is generated between the ceiling portion and the plasma inside the chamber while the workpiece is being processed, which makes plasma ions collide against the ceiling portion. The collision of the ions causes the products which have adhered onto the ceiling portion to easily fall in some parts and to be engaged in the minute concave portions in other parts, and as a result, to become harder to be removed during cleaning. In this case, when the average surface roughness Ra of the minute uneven portion is set within an appropriate range, the minute uneven portion brings about the function of enhancing the adhesion of the products, and the function of the ceiling portion enhancing the adhesion of the products inside the chamber is maintained in a stable manner, without conducting intensive cleaning.

In a case where the workpiece comprises a unit to be processed which is composed of materials containing at least one of polycrystalline silicon, amorphous silicon, and single crystal silicon; and the electronic device production apparatus is an etching apparatus for etching the unit to be processed of the workpiece, it is preferable to provide a gas supply device for introducing a gas including chlorine or bromine into the chamber.

In a case where the workpiece comprises a unit to be processed which is composed of silicon nitride; and the electronic device production apparatus is an etching apparatus for etching the unit to be processed of the workpiece, it is preferable to provide a gas supply device for introducing a gas including fluorine into the chamber.

In a case where the workpiece comprises a unit to be processed which is composed of silicon oxide; and the electronic device production apparatus is an etching apparatus for etching the unit to be processed of the workpiece, it is preferable to provide a gas supply device for introducing a gas including fluorine into the chamber.

These constructions enable the workpiece to be etched smoothly. Furthermore, when the above-mentioned products resulting from the etching of the workpiece contain silicon atoms, and when the above-mentioned ceiling portion on which the products containing silicon atoms adhere is cleaned under severe conditions, the minute unevenness of the ceiling portion is highly likely to be damaged due to a chemical used for removing the products. However, when the average surface roughness Ra of the minute uneven portion of the ceiling portion is set within an appropriate range, the adhered produces can be removed easily without intensive cleaning. Consequently, the function of enhancing the adhesion of the products onto the ceiling portion is maintained in a stable manner during the process.

The second electronic device production apparatus in the present invention is an electronic device production apparatus for producing an electronic device by applying a process to a workpiece, and the electronic device production apparatus comprises: a chamber which is so constructed as to keep an internal atmosphere in an atmosphere for enabling the workpiece to be processed; a workpiece placing unit which is provided inside the chamber to place the workpiece thereon; an internal member which is provided inside the chamber and composed of silica glass; and a minute uneven portion which is formed on a surface of the internal member exposed inside the chamber and which has a function of enhancing adhesion of products generated while the workpiece is being processed, and has an average surface roughness Ra which enables the function to be maintained even after cleaning.

Consequently, the adhesion between the products which adhere onto the minute uneven portion of the inner member and the minute uneven portion is enhanced, which prevents a layer of the products from falling in part due to a temperature change or another reason, so as to reduce the number of particles suspended in the chamber. In addition, the minute uneven portion expands the area of the inner member, which allows more products to adhere thereonto, thereby further decreasing the number of particles suspended in the chamber. Furthermore, by considering the fact that the average surface roughness Ra of the inner member has a deep correlation with the easiness of falling the adhered products and with the easiness of removing the adhered products while the inner member is being cleaned, the above-mentioned apparatus is constructed so that the average surface roughness Ra of the minute uneven portion is within an appropriate range. Consequently, the number of particles which adhere onto a workpiece while the apparatus is used for a long time period can be reduced.

The average surface roughness Ra of the minute uneven portion is preferably 0.2 to 59 $\mu$m.

It has been verified from the results of experiments on silica glass members that the number of particles which adhere onto the workpiece while it is being processed can be reduced in spite of a large number of times of cleaning.

The internal member may be a quartz ring which is provided in such a manner as to enclose the workpiece on the workpiece placing unit, and which controls a gas flow inside the chamber.

The ceiling portion of the chamber may include a gas inlet for introducing gas for processing the workpiece into the chamber; and the internal member may be a quartz distribution plate which is provided in the vicinity of the ceiling portion of the chamber, so as to distribute a flow of the gas introduced through the gas inlet into the chamber.

Consequently, an electric field is generated between the inner member and the plasma inside the chamber while the workpiece is being processed, which makes plasma ions collide against the inner member. The collision of the ions causes the products which have adhered onto the inner member to easily fall in some parts and to be engaged in the minute concave portions in other parts, and as a result, to become harder to be removed during cleaning. In this case, when the average surface roughness Ra of the minute uneven portion is set within an appropriate range, the minute uneven portion brings about the function of enhancing the adhesion of the products, and the function of the inner member enhancing the adhesion of the products inside the chamber is maintained in a stable manner, without conducting intensive cleaning.

The third electronic device production apparatus in the present invention is an electronic device production apparatus for producing an electronic device by applying a process to a workpiece, and the electronic device production apparatus comprises: a chamber which is so constructed as to keep an internal atmosphere in an atmosphere for enabling the workpiece to be processed; a workpiece placing unit which is provided inside the chamber to place the workpiece thereon; and a cooling device for cooling at least part of the chamber.

The cooling device may cool a top-plate portion of the chamber.

According to these constructions, the products becomes harder to volatilize in part of the inner surface of the chamber which is cooled by the cooling device, and the adhesion of the products is enhanced, so that the number of particles suspended in the chamber can be reduced.

The electronic device production method in the present invention comprises the steps of:: placing a workpiece in a chamber and applying a process of producing an electronic device to the workpiece; and cooling at least part of the chamber during the process, thereby stimulating accumulation of products generated during the process on an inner surface of the chamber.

According to this method, the products becomes harder to volatilize in part of the inner surface of the chamber which is being cooled, and the adhesion of the products is enhanced, so that the number of particles suspended in the chamber can be reduced.

It is preferable that the temperature of at least part of the chamber is kept at a fixed degree.

According to this method, in part of the chamber which is being cooled, the products are prevented from falling due to a temperature change, so that the number of particles suspended in the chamber can be further reduced.

DESCRIPTION OF PREFERRED EMBODIMENTS

An apparatus for producing an electronic device in the present invention will be described with reference to the drawings.

(Embodiment 1)

Figure 1:
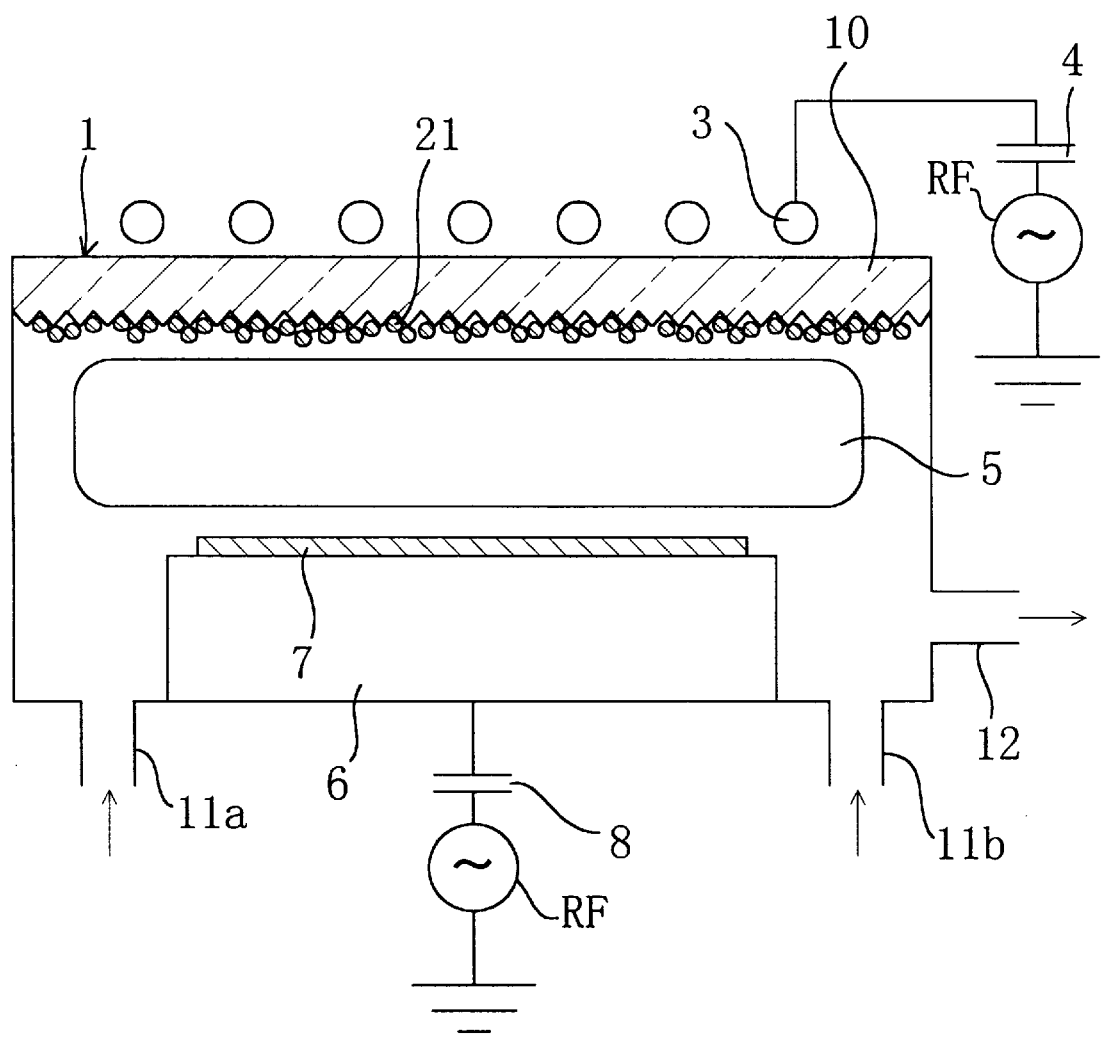
FIG. 1 is a schematic cross section of a dry etching apparatus in the first embodiment.

FIG. 1 is a schematic cross section of a dry etching apparatus with inductively coupled plasma in the first embodiment.

In FIG. 1, the dry etching apparatus comprises a chamber 1, a bottom electrode 6 provided at the bottom portion of the chamber 1, a high frequency coil 3, a plasma area 5 formed inside the chamber 1, a semiconductor substrate 7 as a workpiece which is placed on the bottom electrode 6, blocking capacitors 4 and 8, inlets 11a and 11b for supplying gas into the chamber 1, an outlet 12 for evacuating gas from the chamber 1, and a quartz-top plate 10. In performing dry etching, a high frequency output RF (13.56 MHz) is impressed on the bottom electrode 6 via the blocking capacitor 8, so as to travel reaction spices in the same direction in the plasma area 5. Also, a high frequency output RF (13.56 MHz) is impressed on the coil 3 provided on the quartz-top plate 10 via the blocking capacitor 4, so as to form the plasma area 5 with high density and to etch the semiconductor substrate 7 placed on the bottom electrode 6. In FIG. 1, products 21 resulting from etching adhere onto the bottom surface of the quartz-top plate 10 and are hereinafter referred to as deposits.

When dry etching is conducted by using the plasma apparatus in the present embodiment, the following types of gas are generally used according to the materials of a workpiece to be processed.

In order to etch a polysilicon film, amorphous silicon film, or a silicon substrate, a gas including chlorine or bromine is used. In order to etch a silicon nitride film, a gas including fluorine is used. In order to etch a silicon oxide film, a gas including fluorine such as a mixture of $O_2$ gas, $CF_4$ gas, $C_2F_6$ gas, $C_4F_8$ gas, and $CHF_3$ gas is used.

The present embodiment has a feature that the surface of the quartz-top plate 10 is made to have a minute unevenness instead of being smooth, so as to have a large surface roughness. To be more specific, the surface of a commonly used quartz-top plate is very smooth, that is, the surface roughness is very small, meanwhile the surface of the quartz-top plate 10 which is exposed in the chamber is subjected to a process of roughening the surface in the present embodiment. As such a process, sand blast, grinding with coarse abrasive grains, or the like is available. As a result of these surface treatments, a minute uneven portion is formed on the bottom surface of the quartz-top plate 10, and this minute uneven portion brings about the function of enhancing the adhesion of the deposits 21 onto the quartz-top plate 10. Furthermore, this function is made to be maintained in a stable manner even after the quartz-top 10 is cleaned. The results of experiments on this function will be described as follows.

[Experiments on the Function of Enhancing the Adhesion of Deposits]

Figure 2A:
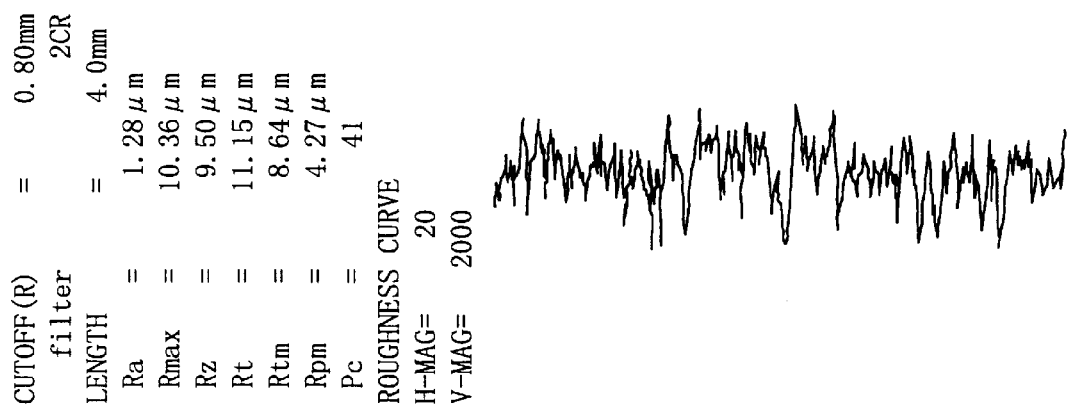
FIGS. 2 (a) and 2 (b) show data on the surface roughness of a quartz-top plate used in the present embodiment and of a commonly used quartz-top plate with a smooth surface, which are measured with a stylus-type surface roughness measuring device.
Figure 2B:
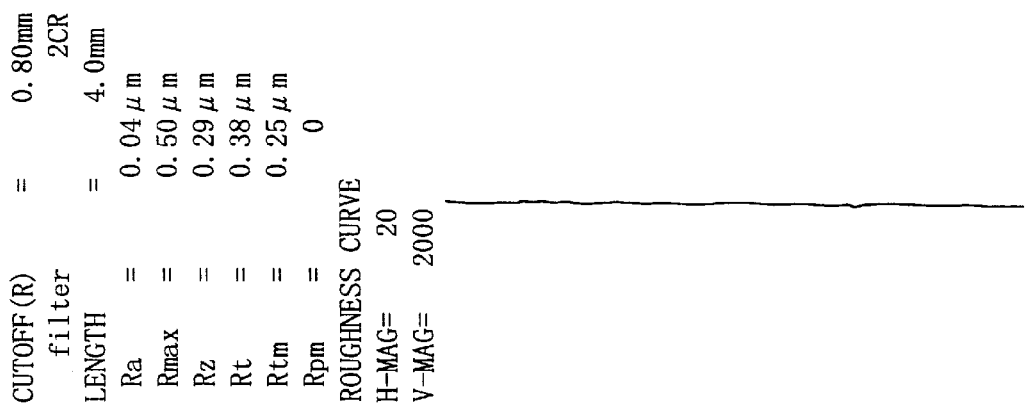

FIGS. 2 (a) and 2 (b) show data on the surface roughness of the quartz-top plate used in the present embodiment and of the commonly used quartz-top plate with the smooth surface, which are measured with a stylus-type surface roughness measuring device. As shown in FIG. 2 (b), the commonly used quartz-top plate has an average surface roughness Ra as small as 0.04 $\mu$m or so. In contrast, as shown in FIG. 2 (a), the quartz-top plate in the present embodiment has an average surface roughness Ra as large as 1.28 $\mu$m as a result of sand blast. In the present embodiment, various samples whose average surface roughness Ra is in a range of 0.2 to 5 $\mu$m are produced, and tests on the number of particles which adhere onto the wafers and on the removal of the deposits on the quartz-top are conducted.

Figure 3:
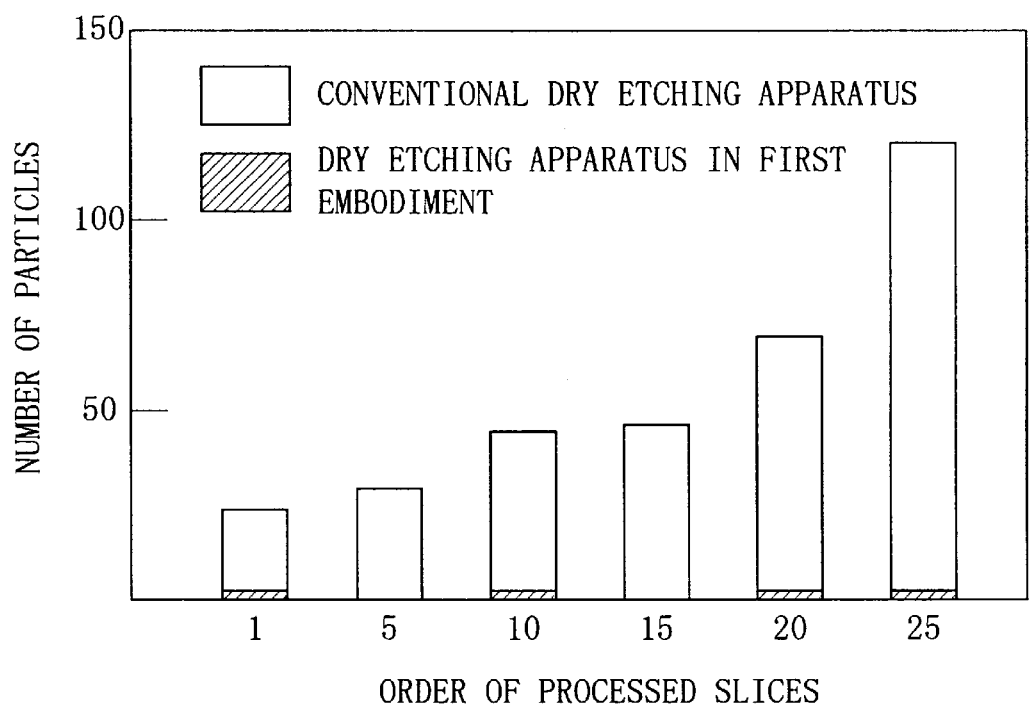
FIG. 3 is a graph showing the relationship between the order of processing slices in one lot and the number of particles in one slice which results in a pattern defect in the dry etching apparatus in the first embodiment and in the dry etching apparatus provided with a quartz-top plate having a smooth surface.

FIG. 3 is a graph showing the relationship between the order of processing slices in one lot and the number of particles in one slice which result in a pattern defect in the dry etching apparatus in the first embodiment and in the dry etching apparatus provided with the quartz-top plate having the smooth surface. In the following description, one lot in the present embodiment corresponds to 25 slices of wafers, and after the completion of the process of the 25th slice, there is a pause and then the slices in the next lot are processed consequently. The data shown in FIG. 3 indicate the number of particles in one lot (25 slices) after about 500 slices of wafers are processed after the chambers are cleaned. When the dry etching apparatus provided with the quartz-top plate having the smooth surface is used, at the beginning of the process of one lot, particles suspended in the chamber are excavated during the pause as shown in FIG. 3, so that the number of particles in the first wafer in one lot is small. Then, the number of particles grows as the consecutive process proceeds, and the 25th slice has more than 10 particles. Thus, it has been proved that there are a number of particles which adhere onto the wafers and that the number of particles depends on the number of slices processed. In contrast, when the dry etching apparatus in the present embodiment is used, the number of particles which adhere onto the wafers in one lot is by no means dependent on the number of slices processed. Furthermore, it is possible to restrict the number of particles in the last slice in one lot to as few as 0 to 3 even after the completion of the process of 500 slices.

Figure 4:
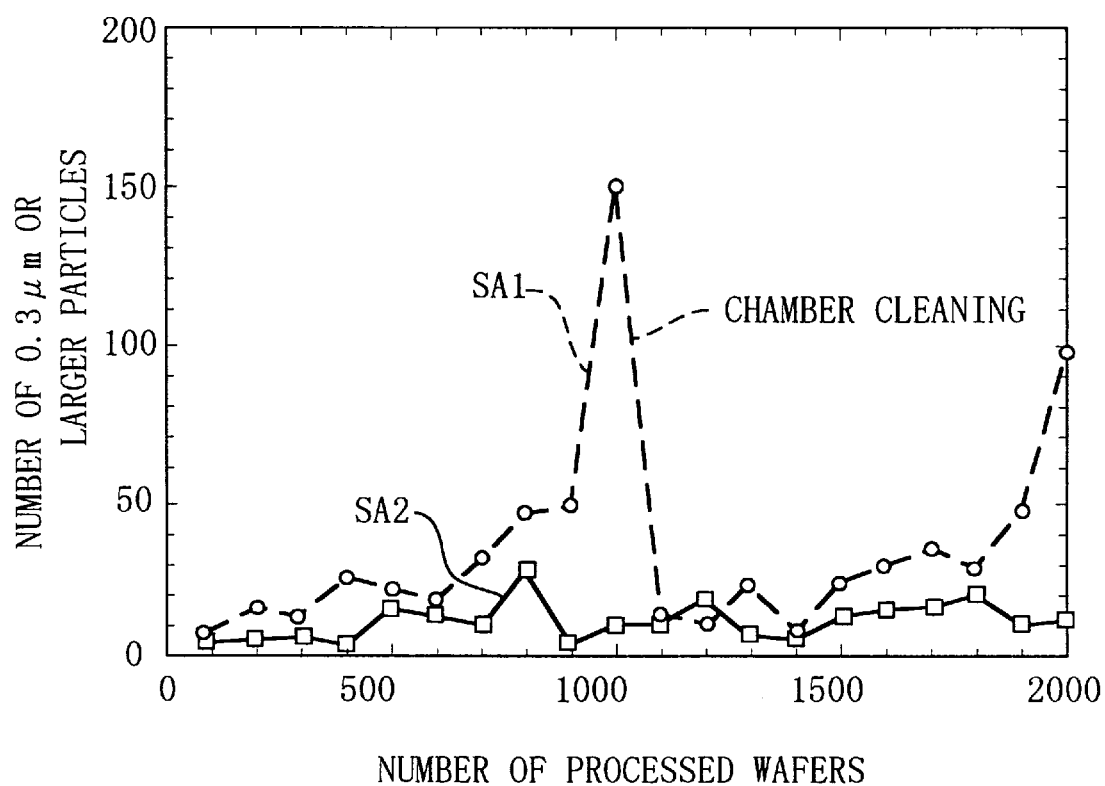
FIG. 4 is a graph showing the relationship between the number of processed wafers and the number of particles of 0.3 μm or larger which have adhered on the wafers, when the dry etching apparatus in the present embodiment is used and when the dry etching apparatus provided with the quartz-top plate having the smooth surface is used

FIG. 4 is a graph showing the relationship between the number of processed wafers and the number of particles of 0.3 $\mu$m or larger which have adhered onto the wafers, when the dry etching apparatus in the present embodiment is used and when the dry etching apparatus provided with the quartz-top plate having the smooth surface is used. The number of particles shown in FIG. 4 is based on the data taken from the first slice in one lot consisting of 25 slices. When the dry etching apparatus provided with the quartz-top plate having the smooth surface is used, as shown by the line graph SA1, the number of particles grows when the number of processed slices reaches around 1000 and at that point the chamber 1 needs cleaning. On the other hand, when the dry etching apparatus in the present embodiment is used, as shown by the line graph SA2, the number of particles does not show any increase even when the number of processed slices reaches around 2000. This realizes a dry etching process which is cleaner and has a higher yield. The data shown by the line graph SA2 in FIG. 4 indicate a tendency commonly observed in the quartz-top plates whose surface roughness Ra is in a range of 0.2 to 5 $\mu$m, which are used for the experiments in the present embodiment. It has turned out that the function of preventing the deposits from falling is high when the average surface roughness Ra is 1 $\mu$m or larger.

The following is the probable cause of the difference in the number of particles which adhere onto the wafers between the dry etching apparatus with the quartz-top plate having the smooth surface and the dry etching apparatus in the present embodiment.

In the dry etching apparatus provided with the quartz-top plate having the smooth surface, part of the deposits on the bottom surface of the quartz-top plate fall in a block and are suspended as particles inside the chamber, so that a number of particles adhere onto the wafers. In contrast, according to the present embodiment, the surface of the quartz-top plate 10 provided inside the chamber 1 is roughen, which enables the adhesion between the surface of the quartz-top plate 10 and the deposits 21 to be maintained at a high level. Therefore, firstly, the high function of adhering the products onto the surface of the quartz-top plate 10 as the deposits 21 can reduce the number of particles suspended in the chamber 1. Secondly, the deposits 21 once formed on the surface of the quartz-top plate 10 are prevented from falling in a block, which further reduces the number of particles suspended in the chamber. Consequently, a cleaner dry etching process can be realized.

It is considered that the roughening of the surface of the quartz-top plate 10 expands the surface area of the quartz-top plate 10, and accordingly, the area for letting the products adhere thereonto is expanded, which also contributes to the reduction of the number of particles suspended in the chamber 1.

To be more specific, in order to enhance the adhesion of the deposits so as to prevent them from falling, the average surface roughness Ra of the minute uneven portion is preferably 0.2 $\mu$m or larger, and most preferably 1 $\mu$m or larger.

[Experiments on Cleaning]

As experiments, quartz-top plates on which particles were thickly accumulated as a result of having been used for plasma etching were cleaned. The experimented main cleaning methods are to rinse a quartz-top plate with running water and then to immerse a quartz-top plate in an about 1% aqueous solution of fluoric acid (an aqueous solution consisting of water and fluoric acid in a volume ratio of 100:1), and to impress ultra-sonic waves thereon. It has turned out that the former method is not effective to remove adhered particles containing silicon atoms, the latter method has an effect of removing adhered particles, and the average surface roughness Ra of a quartz-top plate has an upper limit as follows.

(1) The Relationship Between Average Surface Roughness Ra and Cleaning Time

A quartz-top plate whose average surface roughness Ra is too large requires a long-time ultra-sonic wave cleaning. The rougher the surface of a quartz-top plate is, the longer the quartz-top plate tends to be cleaned. For example, a quartz-top plate whose average surface roughness Ra was 10 $\mu$m needed cleaning for an hour or longer.

(2) Types of Surface Roughness

Generally, there are various methods for indicating surface roughness, and the most frequently used ones are: the maximum surface roughness Rmax which indicates the difference between the highest position (peak) and the lowest position (valley) of the roughness curve obtained when a cross section of the surface of an object to be measured is scanned, and the average roughness Ra which indicates an average roughness of a minute uneven portion. It is certain that as the maximum surface roughness Rmax is larger, the surface area expands, which heightens the function of enhancing the adhesion of the products. However, the function of preventing the adhered products from falling is considered to strongly depend on the average surface roughness Ra. It is particularly probable that the easiness of removing deposits during cleaning has no direct relation with the maximum surface roughness Rmax. This is because the easiness of removing deposits during cleansing should depend not on an increase in the surface area of the minute uneven portion but on the adhesion of the deposits onto the minute uneven portion.

The results of the experiments conducted in the present embodiment have revealed that the cleaning time of a quartz-top plate is more deeply related to the average surface roughness Ra than to the maximum surface roughness Rmax. The reason for this is considered that when the average surface roughness Ra is large, valleys in a minute range becomes deeper, so that deposits are engaged in these deep valleys. Here, having the same maximum surface roughness Rmax does not generally mean having the same average surface roughness Ra. On the other hand, when the average surface roughness Ra becomes larger, the maximum surface roughness Rmax also becomes larger. Thus, it has turned out that although there is an indirect relation between the maximum surface roughness Rmax and the easiness of removing deposits, it is not appropriate to determine the range of the proper roughness of the minute uneven portion from the maximum surface roughness Rmax.

(3) The Relation Between Cleaning Conditions and the Function of Enhancing the Adhesion of Deposits After Cleaning The results of the experiments have revealed that when a quartz-top plate cleaned for many hours is etched, the function of enhancing the adhesion of deposits onto the minute uneven portion of the quartz-top plate is deteriorated. The reason for this is as follows. When a quartz member whose average surface roughness Ra is large is cleaned, if the deposits contain silicon atoms, the quartz member must be cleaned in an aqueous solution consisting of water and HF in an approximate ratio of 100:1 under ultrasonic. When the average surface roughness Ra is as large as about 10 $\mu$m, it needs to be cleaned for about an hour, which makes the surface of the quartz member more even, and as a result, deteriorates the function of enhancing the adhesion of deposits and of preventing them from falling. Therefore, a quartz-top plate having such a large average surface roughness Ra requires a process of recovering the roughness in addition to the cleaning, which makes the quartz-top plate unusable. The same results have been obtained by increasing the concentration of the fluoric acid and shortening the cleaning time. Furthermore, there may be a case that deposits which have deeply burrowed their way into the valleys of the uneven portion remain without being removed and when the quartz-top plate is used next, they fall and adhere as particles onto the substrate. However, if the average surface roughness Ra is 5 $\mu$m or smaller, the deposits can be removed by cleaning in an aqueous solution of fluoric acid under ultrasonic within several minutes. Cleaning within several minutes does not cause any change to the average surface roughness Ra of a quartz-top plate. When the average surface roughness Ra is 2 $\mu$m or smaller, deposits containing silicon atoms can be removed only by cleaning with running water without fluoric acid.

(4) The Average Surface Roughness Ra for Maintaining the Function of Enhancing the Adhesion of Deposits Even After a Quartz-top Plate has been Repeatedly Cleaned Thus, in order to draw out the function of enhancing the adhesion of deposits in a stable manner after a number of times of cleaning, the average surface roughness Ra of the quartz-top plate is most preferably 2 $\mu$m or below. However, as long as the average surface roughness Ra is 5 $\mu$m or below, the quartz-top plate is sufficiently practicable although it may require a process of recovering the roughness of the surface after a number of times of cleaning.

[The Optimum Surface Roughness of a Minute Uneven Portion Obtained by Taking These experiments into consideration]

After considering these results, the optimum surface roughness of a quartz-top plate is more strongly dependent on a range of the average surface roughness Ra than on the maximum surface roughness Rmax. From the two viewpoints, that is, the function of enhancing the adhesion of deposits while the apparatus is in use and the prevention of this function from deteriorating after cleaning, the preferable range of the average surface roughness Ra of the quartz-top plate is 0.2 to 5 $\mu$m, and the most preferable range is 1 to 2 $\mu$m.

The following is a description of the difference between a plasma apparatus which utilizes the above-mentioned conventional ECR-type plasma and a dry etching apparatus which is the plasma apparatus in the present embodiment.

In the plasma apparatus which utilizes the inductively coupled plasma used in the present embodiment, the quartz-top plate 10 is positively charged because electromagnetic waves generated by the high frequency power impressed on the coil 3 pass through the quartz-top plate 10. There is a voltage Vdc between the plasma 5 created inside the chamber 1 and the quartz-top plate 10, and the ions which are accelerated by the voltage Vdc collide against the quartz-top plate 10. Therefore, if the adhesion between the deposits 21 and the quartz-top plate 10 is weak, the collision of the ions may cause the deposits 21 to come off. For this reason, when the commonly used quartz-top plate having the smooth surface is used, the bottom portion of the coil 3 shown in FIG. 1 tends to come off selectively. On the other hand, when the quartz-top plate 10 having a minute uneven portion as in the present invention, the deposits 21 which burrow their way into the valleys of the minute uneven portion are hit by the ions and engaged fast in the valleys, becoming harder to be removed during cleaning. Therefore, when the valleys of the minute uneven portion are too deep, the deposits cannot be removed unless the cleaning conditions of the quartz-top plate 10 are strict.

In contrast, in the case of the conventional plasma apparatus, as shown in FIG. 1 of the above-mentioned Japanese Laid-open Patent Application, a magnetic field is formed by the excitement coil 12 while a microwave is introduced in the plasma creation chamber 1 to create plasma. The plasma thus created is led above the table 8 in the sample chamber 3 by the divergent magnetic field which is formed by the excitement coil 12. In such a construction, the voltage Vdc hardly exists between the plasma and the bell jar, so that there is no fear that deposits are hit by plasma ions unlike in the present embodiment. Therefore, the mechanism of adhering deposits onto the inner surface of the bell jar is considered to be different from that of the present embodiment.

Thus, the determination of a proper range of the surface roughness of the minute uneven portion not by the maximum surface roughness Rmax but by the average surface roughness Ra can draw out remarkable effects in an electronic device production apparatus which utilizes either inductively coupled plasma for creating plasma having a voltage Vdc between the plasma area and the member on which the minute uneven portion is formed, or later-described capacitive coupled plasma.

Furthermore, the removal of deposits containing silicon atoms requires ultra-sonic cleaning with an aqueous solution of fluoric acid; however, deposits such as aluminum can be removed with running water, so that there is no fear that the surface of a member made of silica glass becomes more even. Thus, when a minute uneven portion is provided to the member made of silica glass, great effects can be expected in a plasma apparatus for carrying out a process such as the generation of deposits containing silicon atoms.

(Embodiment 2)

Figure 5:
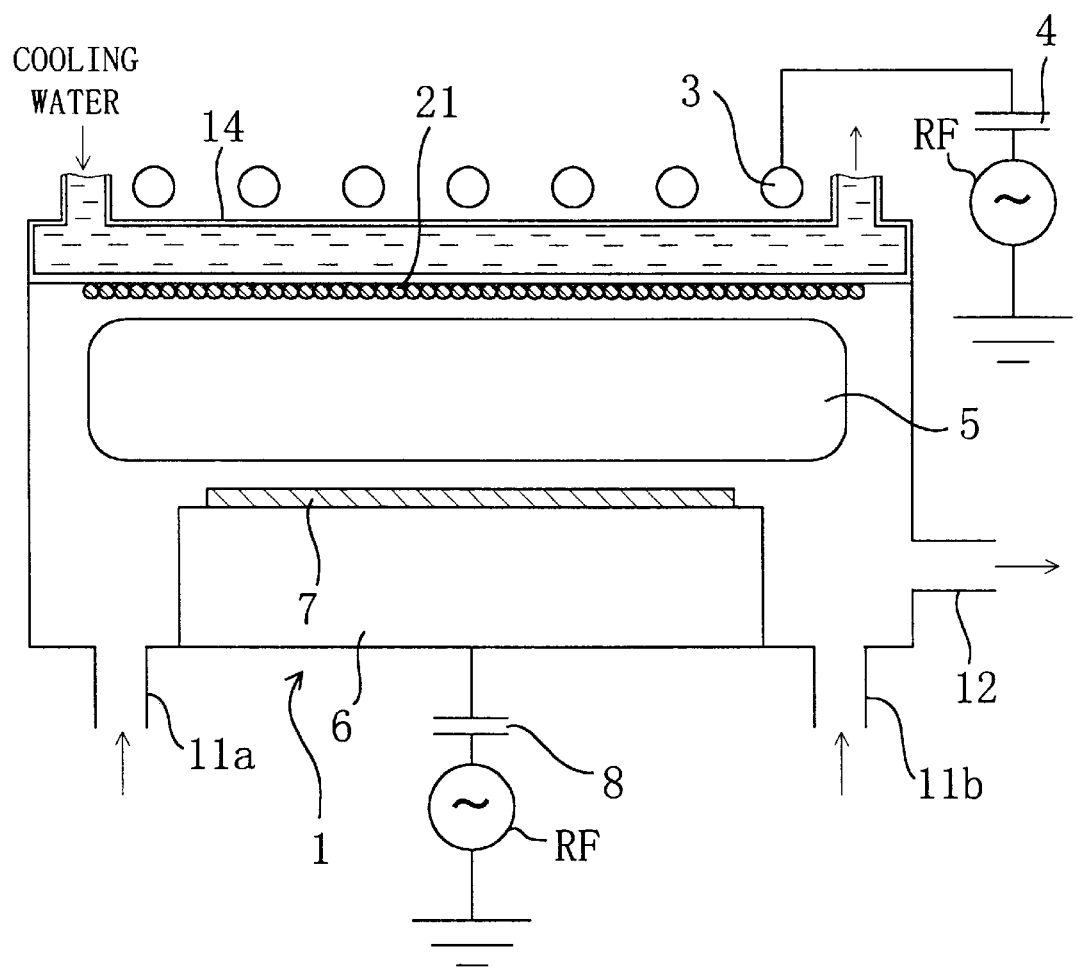
FIG. 5 is a schematic cross section of a dry etching apparatus in the second embodiment.

FIG. 5 is a schematic cross section of a dry etching apparatus in the present embodiment. In FIG. 5, the dry etching apparatus comprises a chamber 1, a bottom electrode 6 provided at the bottom portion of the chamber 1, a high frequency coil 3, a plasma area 5 formed inside the chamber 1, a semiconductor substrate 7 as a workpiece placed on the bottom electrode 6, blocking capacitors 4 and 8, inlets 11a and 11b for supplying gas into the chamber 1, an outlet 12 for evacuating gas from the chamber 1, and a quartz-top plate 14. In performing dry etching, a high frequency output RF (13.56 MHz) is impressed on the bottom electrode 6 via the blocking capacitor 8, so as to travel reaction species in the same direction in the plasma area 5. Also, a high frequency output RF (13.56 MHz) is impressed on the coil 3 provided on the quartz-top plate 14 via the blocking capacitor 4, so as to form the plasma area 5 with high density and to etch the semiconductor substrate 7 placed on the bottom electrode 6.

The present embodiment has a feature that the quartz-top plate 14 is formed to have a hollow for pouring cooling water thereinto, thereby stimulating the adhesion of the deposits 21 onto the quartz-top plate 14. In the present embodiment, the surface of the quartz-top plate 14 is made smooth, without being subjected to the process of roughening the surface as in the first embodiment.

The present embodiment can bring about the same effects as the first embodiment shown in FIGS. 3 and 4 by conducting the following actions.

First of all, by cooling the quartz-top plate 14 to a low temperature, the effect of accumulating products onto the quartz-top plate 14 can be enhanced, and accordingly, the number of particles suspended in the chamber 1 can be reduced.

By keeping cooling the quartz-top plate 14 at a certain degree, the falling of the deposits 21, which is caused by a heating and cooling cycle of the quartz-top plate having a thermal coefficient different from the deposits 21, can be restricted. As a result, the number of particles suspended in the chamber 1 can be reduced, which brings about remarkable effects.

The present invention is not restricted to the present embodiment: instead of fixing the temperature at a certain level, the quartz-top plate have only to be cooled.

In the present embodiment, since the surface of the quartz-top plate 14 does not need to be roughened, there is no need of considering the deterioration of the function of enhancing the adhesion of deposits due to cleaning, as a rule. However, when the bottom surface of the quartz-top plate 14 is roughen in the same manner as in the first embodiment in addition to the construction of the present embodiment, the preferable range of the average surface roughness Ra is 0.2 to 5 $\mu$m, and the most preferable range is 1 to 2 $\mu$m.

(Embodiment 3)

Figure 6:
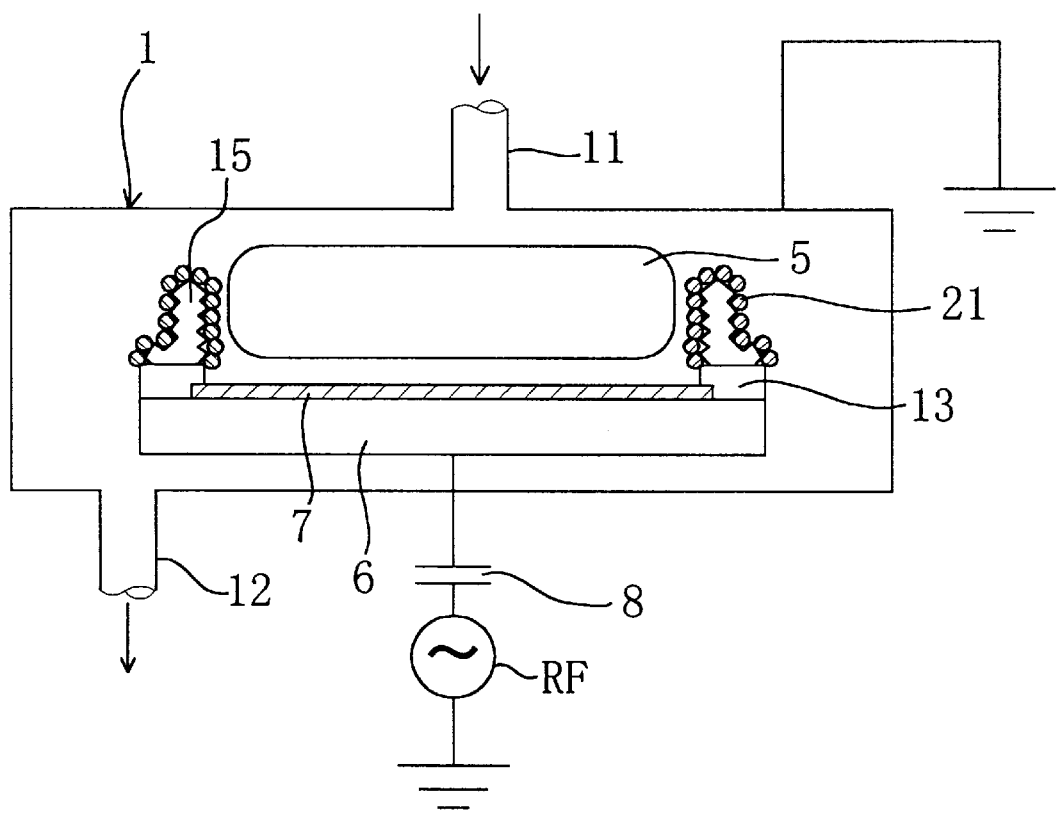
FIG. 6 is a schematic cross section of a dry etching apparatus in the third embodiment.

The third embodiment will be described as follows. FIG. 6 is a schematic cross section of a dry etching apparatus for conducting RIE (reactive ion etching) which utilizes capacitive coupled plasma in the present embodiment.

In FIG. 6, the dry etching apparatus comprises a chamber 1, a bottom electrode 6 provided at the bottom portion of the chamber 1, a plasma area 5 formed inside the chamber 1, a semiconductor substrate 7 as a workpiece placed on the bottom electrode 6, a blocking capacitor 8, an inlet 11 for supplying gas into the chamber 1, and an outlet 12 for evacuating gas from the chamber 1. In performing dry etching, a high frequency output RF (13.56 MHz) is impressed on the bottom electrode 6 via the blocking capacitor 8, so as to form the plasma area 5 and to etch the semiconductor substrate 7 placed on the bottom electrode 6.

The present embodiment has features that as shown in FIG. 6, a quartz ring 15 is provided on a clamp 13 in order to control the gas flow and to enhance the evenness of etching, and that the surface of the quartz ring 15 is roughen so as to stimulate the adhesion of the deposits 21 onto the quartz ring 15.

Figure 7:
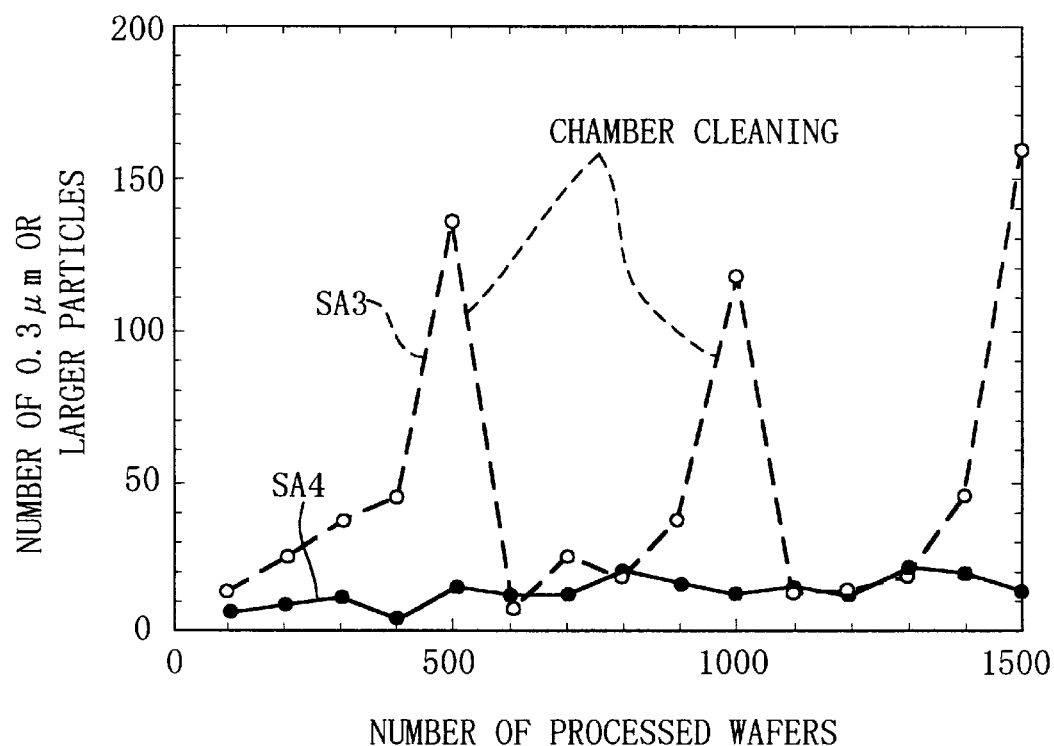
FIG. 7 is a graph showing the relation between the number of processed wafers and the number of particles of 0.3 μm or larger which have adhered onto the wafers, when a dry etching apparatus utilizing a quartz ring having a smooth surface is used and when a dry etching apparatus in the present embodiment is used.

FIG. 7 is a graph showing the relation between the number of processed wafers and the number of particles of 0.3 $\mu$m or larger which adhere onto the wafers, when a dry etching apparatus utilizing a quartz ring having a smooth surface is used and when a dry etching apparatus in the present embodiment is used. The number of particles shown in FIG. 7 is based on the data taken from the first slice in one lot consisting of 25 slices. When the dry etching apparatus provided with the quartz ring having the smooth surface is used, as shown by the line graph SA3, the number of particles grows when the number of processed slices reaches around 500 and at that point the chamber 1 needs cleaning. On the other hand, when the dry etching apparatus in the present embodiment is used, as shown by the line graph SA4, the number of particles does not show any increase even when the number of processed slices reaches 1500. This realizes a dry etching process which is cleaner and has a higher yield.

The results of the same experiments on cleaning as in the first embodiment have revealed that in the present embodiment, too, the preferable range of the average surface roughness Ra of the quartz ring is 0.2 to 5 $\mu$m, and the most preferable range is 1 to 2 $\mu$m, from the viewpoint of providing the quartz ring with the function of enhancing the adhesion of deposits and preventing this function from being deteriorated due to cleaning.

In the plasma creation apparatus which utilizes the capacitive coupled plasma in the present embodiment, too, the voltage Vdc exists between the plasma 5 and the quartz ring 15, so that the adhering conditions of deposits onto a minute uneven portion is considered to be the same as those in the first embodiment. Therefore, the determination of a proper range of the surface roughness of the minute uneven portion not by the maximum surface roughness Rmax but by the average surface roughness Ra can draw out remarkable effects in an electronic device production apparatus as in the present embodiment.

Furthermore, the removal of deposits containing silicon atoms requires ultra-sonic cleaning with an aqueous solution of fluoric acid; however, deposits such as aluminum can be removed with running water, so that there is no fear that the surface of a member made of silica glass becomes more even. Thus, when a minute uneven portion is provided to the member made of silica glass, great effects can be expected in a plasma apparatus for carrying out a process such as generation of deposits containing silicon atoms.

(Embodiment 4)

The fourth embodiment will be described as follows.

Figure 8:
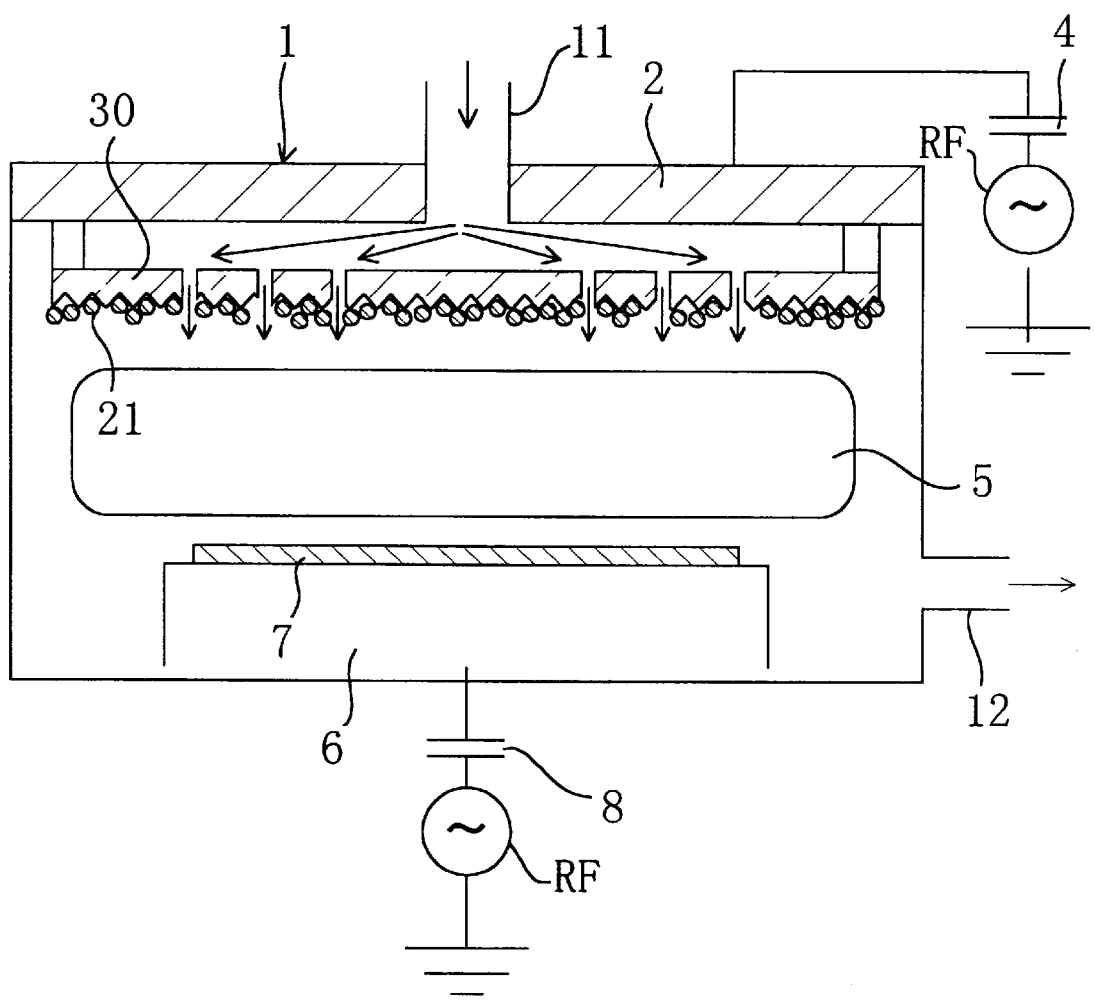
FIG. 8 is a schematic cross section of a dry etching apparatus in the fourth embodiment.

FIG. 8 is a schematic cross section of a dry etching apparatus which utilizes inductively coupled plasma in the fourth embodiment.

In FIG. 8, the dry etching apparatus comprises a chamber 1, a top electrode 2, a bottom electrode 6 provided at the bottom portion of the chamber 1, a plasma area 5 formed inside the chamber 1, a semiconductor substrate 7 as a workpiece placed on the bottom electrode 6, blocking capacitors 4 and 8, an inlet 11 for supplying gas into the chamber 1, and an outlet 12 for evacuating gas from the chamber 1. In performing dry etching, a high frequency output RF (13.56 MHz) is impressed on the bottom electrode 6 via the blocking capacitor 8, so as to travel reaction species in the same direction in the plasma area 5. Also, a high frequency output RF (13.56 MHz) is impressed on the top electrode 2 via the blocking capacitor 4, so as to form the plasma area 5 with high density and to etch the semiconductor substrate 7 placed on the bottom electrode 6.

The present embodiment has features that a quartz distribution plate 30 is provided below the top electrode 2 in order to distribute gas introduced through the inlet 11 and let it flow into the chamber 1, and that the bottom surface of the quartz distribution plate 30 is not smooth but is made slightly rough so as to stimulate the deposits 21 to adhere onto the quartz distribution plate 30. In other words, a process of roughening the bottom surface of the quartz distribution plate 30 is applied. As such a process of roughening a surface, sand blast, grinding with coarse abrasive grains, or the like is available. The average surface roughness Ra of the bottom surface of the quartz distribution plate 30 is within a range of 0.2 to 5 $\mu$m.

In the plasma apparatus in the present embodiment, the same gas as that in the first embodiment can be used to dry-etch the same workpiece as that in the first embodiment.

In the present embodiment, the quartz distribution plate 30 uniforms the gas flow in the chamber 1 so as to secure the evenness of etching on the semiconductor substrate 7, and the bottom surface of the quartz distribution plate 30 is roughen. As a result, the function of adhering products which result from an etching process is enhanced and the adhesion of the deposits is enhanced so as to prevent them from falling. Furthermore, because the average surface roughness Ra is within a proper range, the function is effectively maintained even after cleaning.

In the etching apparatus in the present embodiment, a voltage Vdc exists between the quartz distribution plate 30 and the plasma 5. Consequently, when cleaning is started to remove deposits, the deposits are already engaged in the minute uneven portion of the quartz distribution plate 30, so that the application of the present invention is effective.

(Embodiment 5)

Figure 9:
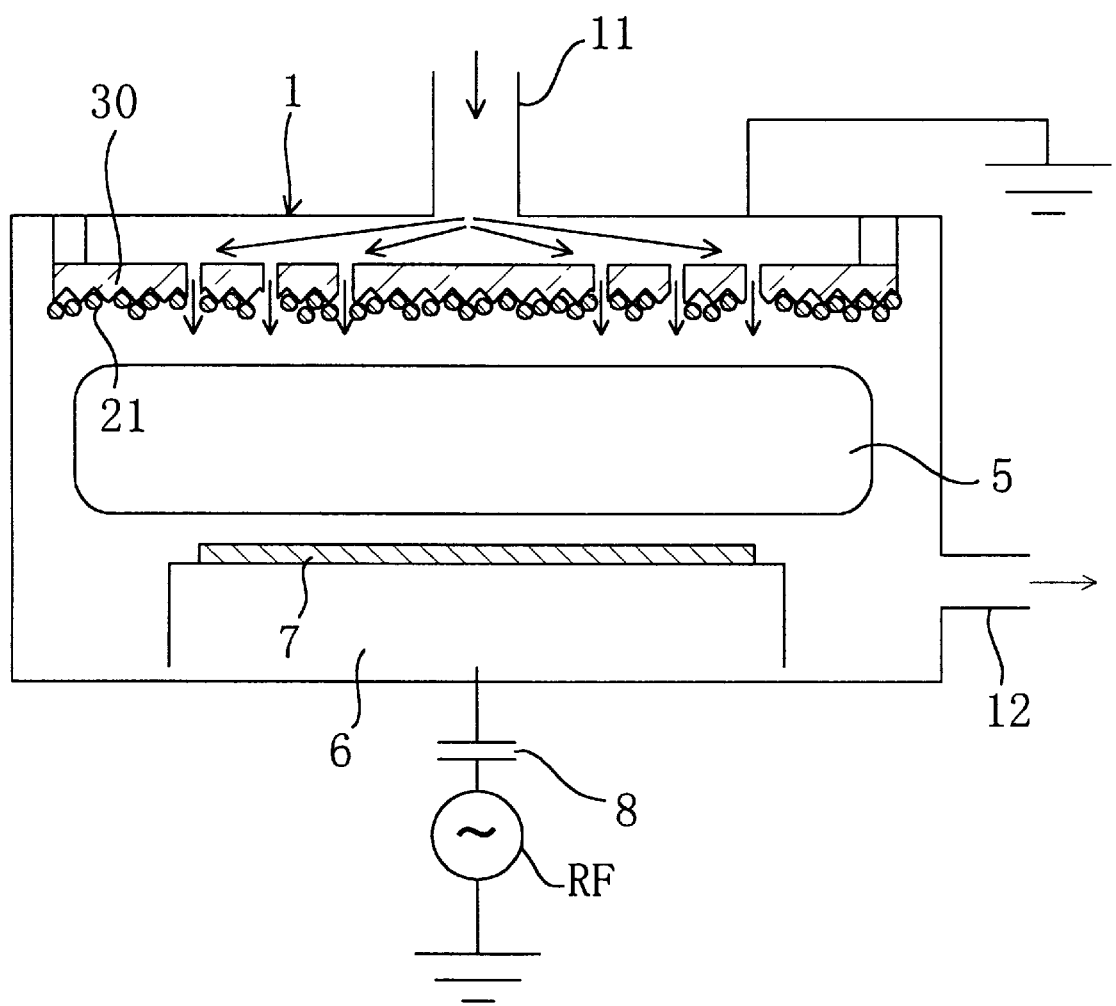
FIG. 9 is a schematic cross section of a dry etching apparatus in the fifth embodiment.
Figure 10:
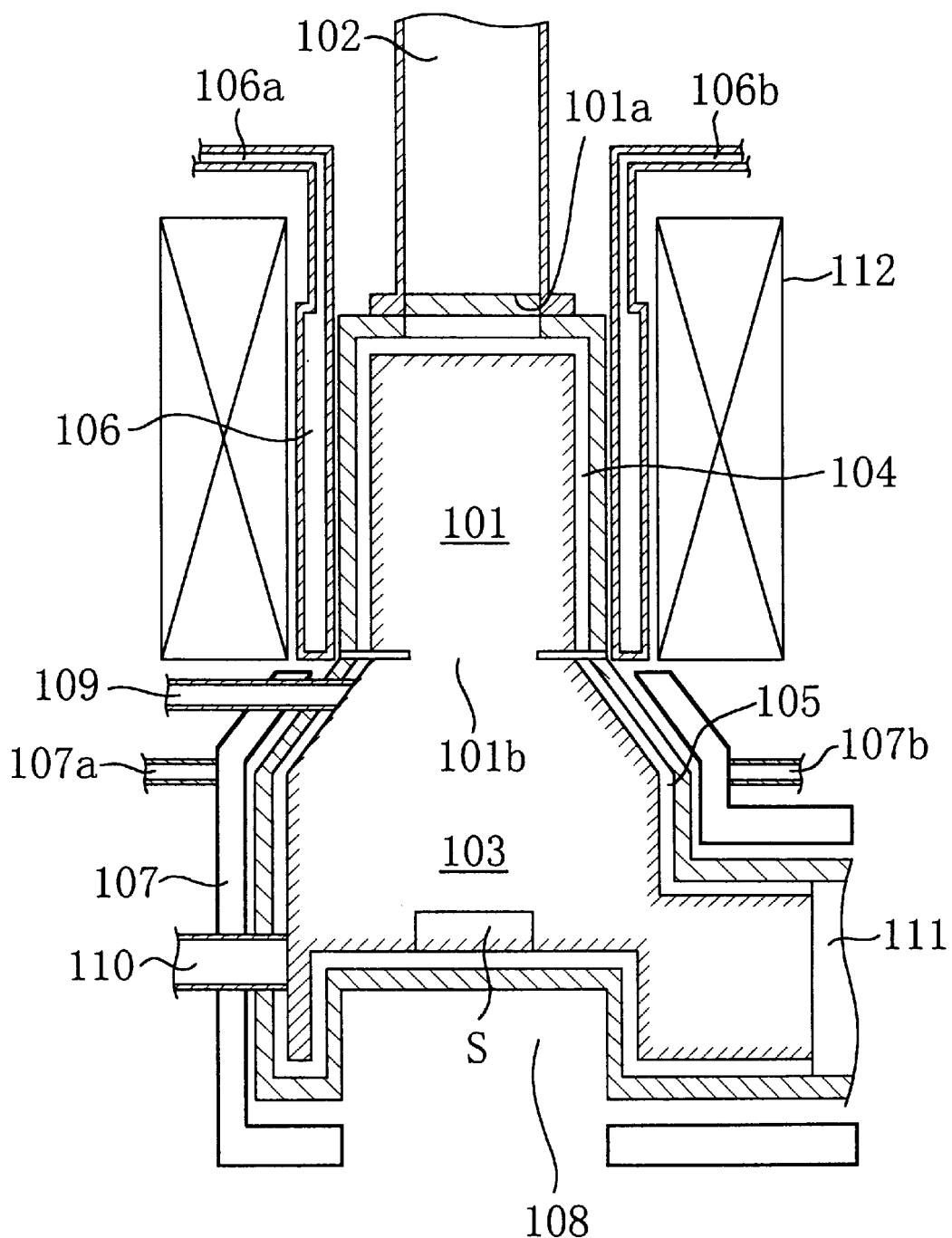
FIG. 10 is a cross section of a plasma apparatus which makes use of conventional ECR-type plasma.

The fifth embodiment will be described as follows. FIG. 9 is a schematic cross section of a dry etching apparatus for conducting RIE (reactive ion etching) which utilizes capacitive coupled plasma in the present embodiment.

In FIG. 9, the dry etching apparatus comprises a chamber 1, a bottom electrode 6 provided at the bottom portion of the chamber 1, a plasma area 5 formed inside the chamber 1, a semiconductor substrate 7 as a workpiece placed on the bottom electrode 6, a blocking capacitor 8, an inlet 11 for supplying gas into the chamber 1, and an outlet 12 for evacuating gas from the chamber 1. In performing dry etching, a high frequency output RF (13.56 MHz) is impressed on the bottom electrode 6 via the blocking capacitor 8, so as to form the plasma area 5 and to etch the semiconductor substrate 7 placed on the bottom electrode 6.

The present embodiment has features that a quartz distribution plate 30 is provided in the top of the chamber 1 in order to distribute gas introduced through the inlet 11 and let it flow into the chamber 1, and that the bottom surface of the quartz distribution plate 30 is not smooth but is made slightly rough so as to stimulate the adhesion of the deposits 21 onto the quartz distribution plate 30. In other words, a process of roughening the bottom surface of the quartz distribution plate 30 is applied. As such a process of roughening a surface, sand blast, grinding with coarse abrasive grains, or the like is available. The average surface roughness Ra of the bottom surface of the quartz distribution plate 30 is within a range of 0.2 to 5 $\mu$m.

In the present embodiment, too, the quartz distribution plate 30 uniforms the gas flow in the chamber 1 so as to secure the evenness of etching on the semiconductor substrate 7, and the bottom surface of the quartz distribution plate 30 is roughen. As a result, the function of adhering products which result from an etching process is enhanced and the adhesion of the deposits is enhanced so as to prevent them from falling. Furthermore, because the average surface roughness Ra is within a proper range, the function is effectively maintained even after cleaning.

In the etching apparatus in the present embodiment, too, a voltage Vdc exists between the quartz distribution plate 30 and the plasma 5. Consequently, by the time when cleaning is started to remove deposits, the deposits are already engaged in the minute uneven portion of the quartz distribution plate 30, so that the application of the present invention is effective.

(Others)

In the first and third through fifth embodiments, the surfaces of the quartz-top plate 10, the quartz ring 15 and the quartz distribution plate 30 are roughen; however, the same effects can be obtained by roughening the inner wall of the casing of the chamber 1 composed of aluminum or the like. Furthermore, the effects of the present invention can be brought about by roughening the surface of the electrode whose surface portion is exclusively coated with a glass substance, instead of making the entire parts from glass.

The effects of the present invention can also be obtained by intentionally providing a minute uneven portion, which has comparatively too large unevenness to be regarded as surface roughness but can be regarded as a minute uneven portion considering its size on the inner wall of the chamber or on the surface of the inner member so as to expand their surfaces.

The surfaces of transparent members such as silica glass are usually made smooth like a mirror surface in order to let light penetrate; however, the effects of the present invention can be brought about by roughening the surface of such glass members.

Although the present invention is applied to a dry etching apparatus in each of the above embodiments, the present invention is not restricted to these embodiments, but can be applied to any type of processing apparatus such as plasma CVD or an apparatus which does not use plasma like a spattering apparatus. In addition, the present invention is not restricted to an electronic device production apparatus, but can be applied to any electronic device such as a liquid crystal device which involves the problem of the adhesion of particles.

What is claimed is:

1. An electronic device production apparatus for producing an electronic device by applying a process to a workpiece, said electronic device production apparatus comprising:
   a chamber which is so constructed as to keep an internal atmosphere in an atmosphere for enabling said workpiece to be processed;
   a workpiece placing unit which is provided inside said chamber, said workpiece placing unit placing said workpiece thereon; and
   a minute uneven portion which is formed on a inner surface of a ceiling portion of said chamber, said minute uneven portion having an average surface roughness Ra of 0.2 to 5 μm.

2. The electronic device production apparatus according to claim 1, wherein said ceiling portion is made from silica glass.

3. The electronic device production apparatus for producing an electronic device by applying a process to a workpiece, said electronic device production apparatus comprising:
   a chamber which is so constructed as to keep an internal atmosphere in an atmosphere for enabling said workpiece to be processed;
   a workpiece placing unit which is provided inside said chamber, said workpiece placing unit placing said workpiece thereon;
   a minute uneven portion which is formed on an inner surface of a ceiling portion of said chamber, said minute uneven portion having a function of enhancing adhesion of products generated while said workpiece is being processed, and having an average surface roughness Ra which enables said function to be maintained even after cleaning of said ceiling portion; and
   a coil which is provided outside said chamber and in a vicinity of said ceiling portion, said coil transmitting an electromagnetic wave for creating inductively coupled plasma inside said chamber.

4. The electronic device production apparatus for producing an electronic device by applying a process to a workpiece, said electronic device production apparatus comprising:
   a chamber which is so constructed as to keep an internal atmosphere in an atmosphere for enabling said workpiece to be processed;
   a workpiece placing unit which is provided inside said chamber, said workpiece placing unit placing said workpiece thereon;
   a minute uneven portion which is formed on an inner surface of a ceiling portion of said chamber, said minute uneven portion having a function of enhancing adhesion of products generated while said workpiece is being processed, and having an average surface roughness Ra which enables said function to be maintained even after cleaning of said ceiling portion; and
   a gas supply device for introducing a gas capable of etching a portion to be processed of said workpiece into said chamber;
   wherein:
       said portion to be processed is composed of materials containing at least one of polycrystalline silicon, amorphous silicon, single crystal silicon silicon nitride and silicon oxide; and
       said electronic device production apparatus is an etching apparatus for etching said portion to be processed of said workpiece.

5. An electronic device production apparatus for producing an electronic device applying a process to a workpiece, said electronic device production apparatus comprising:
   a chamber which is so constructed as to keep an internal atmosphere in an atmosphere for enabling said workpiece to be processed;
   a workpiece placing unit which is provided inside said chamber, said workpiece placing unit placing said workpiece thereon;
   an internal member which is provided inside said chamber and composed of silica glass; and
   a minute uneven portion which is formed on a surface of said internal member, said surface being exposed inside said chamber, said minute uneven portion having an average surface roughness Ra of 0.2 to 5 μm.

6. The electronic device production apparatus for producing an electronic device applying a process to a workpiece, said electronic device production apparatus comprising:
   a chamber which is so constructed as to keep an internal atmosphere in an atmosphere for enabling said workpiece to be processed;
   a workpiece placing unit which is provided inside said chamber, said workpiece placing unit placing said workpiece thereon;
   a quartz ring which is provided in such a manner as to enclose said workpiece on said workpiece placing unit, said quartz ring controlling a gas flow inside said chamber; and
   a minute uneven portion which is formed on a surface of said quartz ring, said surface being exposed inside said chamber, said minute uneven portion having a function of enhancing adhesion of products generated while said workpiece is being processed, and having an average surface roughness Ra which enables said function to be maintained even after cleaning.

7. The electronic device production apparatus for producing an electronic device applying a process to a workpiece, said electronic device production apparatus comprising:
   a chamber which is so constructed as to keep an internal atmosphere in an atmosphere for enabling said workpiece to be processed;
   a workpiece placing unit which is provided inside said chamber, said workpiece placing unit placing said workpiece thereon;
   a gas inlet for introducing gas for processing said workpiece into said chamber, said gas inlet provided in a ceiling portion of said chamber;
   a quartz distribution plate which is provided in a vicinity of said ceiling portion of said chamber, said quartz distribution plate distributing a flow of the gas introduced through said gas inlet into said chamber; and
   a minute uneven portion which is formed on a surface of said quartz distribution plate, said surface being exposed inside said chamber, said minute uneven portion having a function of enhancing adhesion of products generated while said workpiece is being processed, and having an average surface roughness Ra which enables said function to be maintained even after cleaning.

8. The electronic device production apparatus for producing an electronic device applying a process to a workpiece, said electronic device production apparatus comprising:
   a chamber which is so constructed as to keep an internal atmosphere in an atmosphere for enabling said workpiece to be processed;

a workpiece placing unit which is provided inside said chamber, said workpiece placing unit placing said workpiece thereon;

an internal member which is provided inside said chamber and composed of silica glass;

a minute uneven portion which is formed on a surface of said internal member, said surface being exposed inside said chamber, said minute uneven portion having a function of enhancing adhesion of products generated while said workpiece is being processed, and having an average surface roughness Ra which enables said function to be maintained even after cleaning; and a gas supply device for introducing a gas capable of etching a portion to be processed of said workpiece;

wherein:

said portion to be processed is composed of materials containing at least one of polycrystalline silicon, amorphous silicon, single crystal silicon silicon nitride and silicon oxide; and said electronic device production apparatus is an etching apparatus for etching said portion to be processed of said workpiece.

9. An electronic device production apparatus according to claim 1, further comprising:

a cooling means for cooling at least part of said ceiling portion of said chamber.

10. A method of producing an electronic device using an electronic device production apparatus which comprises:

a chamber which is so constructed as to keep an internal atmosphere in an atmosphere for enabling said workpiece to be processed;

a workpiece placing unit which is provided inside said chamber, said workpiece placing unit placing said workpiece thereon; and a minute uneven portion which is formed on an inner surface of a ceiling portion of said chamber, said minute uneven portion having an average roughness of 0.2 to 5 μm, said method comprising the steps of:

(a) disposing said workpiece on said workpiece placing unit; and (b) processing said workpiece.

11. The method of producing an electronic device according to claim 10, further comprising the step of:

(c) cleaning said-minute uneven portion of said chamber using an acid, wherein said step (c) is performed after said steps of (a) and (b) are performed a plurality of times.

12. The method of producing an electronic device according to claim 10, wherein during said step (b), at least a portion of said ceiling portion of said chamber is cooled to enhance adhesion of products generated in said step (b) on said inner surface of said chamber.

13. The method of producing an electronic device using an electronic device production apparatus comprising:

a chamber which is so constructed as to keep an internal atmosphere in an atmosphere for enabling a workpiece to be processed;

a workpiece placing unit which is provided inside said chamber, said workpiece placing unit placing said workpiece thereon; and a minute uneven portion which is formed on an inner surface of a ceiling portion of said chamber, said minute uneven portion having a function of enhancing adhesion of products generated while said workpiece is being processed, and having an average surface roughness Ra which enables said function to be maintained even after cleaning of said ceiling portion; and a coil which is provided outside said chamber and in a vicinity of said ceiling portion, said coil transmitting an electromagnetic wave for creating inductively coupled plasma inside said chamber;

said method comprising the steps of:

(a) disposing said workpiece on said workpiece placing unit; and (b) creating plasma and processing said workpiece using said created plasma.

14. The method of producing an electronic device according to claim 13, further comprising the step of:

(c) cleaning said minute uneven portion of said chamber using an acid, wherein said step (c) is performed after said steps (a) and (b) are performed a plurality of times.

15. The method of producing an electronic device according to claim 13, wherein during said step (b), at least a portion of said ceiling portion of said chamber is cooled to further enhance adhesion of products generated in said step (b) on said inner surface of said chamber.

16. The method of producing an electronic device using an electronic device production apparatus comprising:

a chamber which is so constructed as to keep an internal atmosphere in an atmosphere for enabling a workpiece to be processed;

a workpiece placing unit which is provided inside said chamber, said workpiece placing unit placing said workpiece thereon;

an internal member which is provided inside said chamber and composed of silica glass; and a minute uneven portion which is formed on a surface of said internal member, said surface being exposed inside said chamber, said minute uneven portion having an average surface roughness Ra of 0.2 to 5 μm;

said method comprising the steps of:

(a) disposing said workpiece on said workpiece placing unit; and (b) processing said workpiece.

17. The method of producing an electronic device according to claim 16, further comprising the step of:

(c) cleaning said minute uneven portion of said chamber using an acid, wherein said step (c) is performed after said steps (a) and (b) are performed a plurality of times.

18. The method of producing an electronic device using an electronic device production apparatus comprising:

a chamber which is so constructed as to keep an internal atmosphere in an atmosphere for enabling said workpiece to be processed;

a workpiece placing unit which is provided inside said chamber, said workpiece placing unit placing said workpiece thereon;

a quartz ring which is provided in such a manner as to enclose said workpiece on said workpiece placing unit, said quartz ring controlling a gas flow inside said chamber; and a minute uneven portion which is formed on a surface of said quartz ring, said surface being exposed inside said chamber, said minute uneven portion having a function of enhancing adhesion of products generated while said workpiece is being processed, and having an average surface roughness Ra which enables said function to be maintained even after cleaning;

said method comprising the step of:
(a) disposing said workpiece on said workpiece placing unit; and
(b) processing said workpiece.

19. The method of producing an electronic device using an electronic device production apparatus comprising:
a chamber which is so constructed as to keep an internal atmosphere in an atmosphere for enabling said workpiece to be processed;
a workpiece placing unit which is provided inside said chamber, said workpiece placing unit placing said workpiece thereon;
a gas inlet for introducing gas for processing said workpiece into said chamber, said gas inlet provided in a ceiling portion of said chamber;
a quartz distribution plate which is provided in a vicinity of said ceiling portion of said chamber, said quartz distribution plate distributing a flow of the gas introduced through said gas inlet into said chamber; and
a minute uneven portion which is formed on a surface of said quartz distribution plate, said surface being exposed inside said chamber, said minute uneven portion having a function of enhancing adhesion of products generated while said workpiece is being processed, and having an average surface roughness Ra which enables said function to be maintained even after cleaning, said method comprising the steps of:
(a) disposing said workpiece on said workpiece placing unit; and
(b) processing said workpiece.

* * * * *